Figure 1:
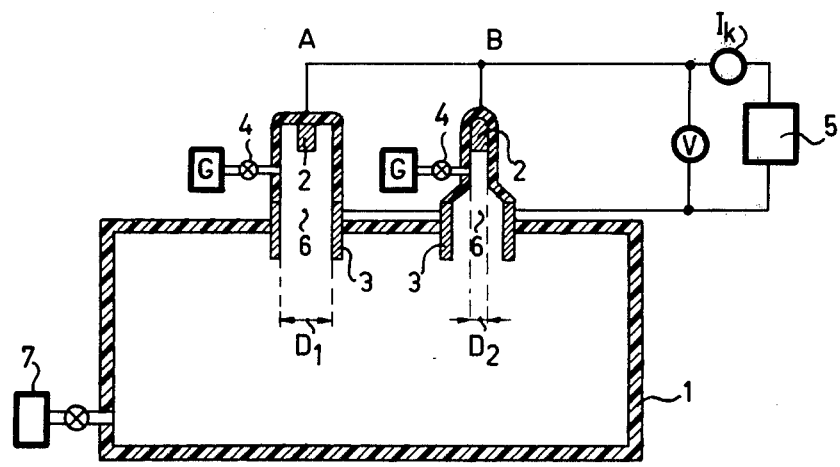

United States Patent [19]

Schoenmakers

[11] 4,163,889
[45] Aug. 7, 1979

[54] DEVICE FOR THE SIMULTANEOUS OPERATION OF A NUMBER OF GAS DISCHARGE ELECTRON GUNS

[75] Inventor: Theodorus M. B. Schoenmakers, Eindhoven, Netherlands

[73] Assignee: U.S. Philips Corporation, New York, N.Y.

[21] Appl. No.: 751,488

[22] Filed: Dec. 17, 1976

Related U.S. Application Data

[63] Continuation of Ser. No. 575,723, May 8, 1975, abandoned.

[30] Foreign Application Priority Data

May 27, 1974 [NL] Netherlands .......................... 7407058

[51] Int. Cl.² ............................................. B23K 15/00
[52] U.S. Cl. ........................... 219/121 EB; 313/231.7; 315/111.8
[58] Field of Search ................ 219/121 EB, 121 EM; 315/111.8, 111.9; 313/231.7, 210, 325

[56] References Cited

U.S. PATENT DOCUMENTS

| 2,746,420 | 5/1956 | Steigerwald | 219/121 EB |
| 3,054,896 | 9/1962 | Jones | 219/121 EB |
| 3,265,801 | 8/1966 | Eaton | 219/121 EB |
| 3,486,064 | 12/1969 | Stauffer | 219/121 EB |
| 3,566,184 | 2/1971 | Maskell | 219/121 EB |
| 3,770,934 | 11/1973 | Randmer | 219/121 EB |

OTHER PUBLICATIONS

"Glow Discharge Beam Techniques", Dugdale et al., Atomic Energy Research Establishment (Great Britain).

Primary Examiner—Bruce A. Reynolds
Assistant Examiner—M. Paschall
Attorney, Agent, or Firm—Algy Tamoshunas

[57] ABSTRACT

A device for the simultaneous operation of a number of gas discharge electron guns in which electron beams produced by the guns have different intensities due to different diameters of discharge spaces and/or due to a different anode-cathode distance.

6 Claims, 2 Drawing Figures

DEVICE FOR THE SIMULTANEOUS OPERATION OF A NUMBER OF GAS DISCHARGE ELECTRON GUNS

This is a continuation of application Ser. No. 575,723, filed May 8, 1975, now abandoned.

The invention relates to a device for the simultaneous operation of a number of gas discharge electron guns and comprising an envelope and means to maintain a gaseous ionisable medium inside said envelope, at least two assemblies of electrodes arranged inside said envelope, each assembly of electrodes being constructed from at least a cylindrical anode which is open at either end, and a cathode located opposite to one of the sides of the cylindrical anode in such a manner that a space is present between the cylindrical anode and the cathode, in which space the glow discharge takes place which generates the electron beam.

Such a device is known from "Glow discharge beam techniques" by R. A. Dugdale, Proc. 6th Int. Congress Electr. Heat. A glow discharge takes place between the electrodes in the said assemblies of electrodes. Positive ions from the glow discharge impinge against the cathode and release there electrons by secondary emission. The secondary electrons are accelerated in the direction of the anode in the electric field between the anode and the cathode. Near the cathode the electric field has such a shape that the flow of ions is directed more or less to a small part of the surface in the centre of the cathode and the secondary electrons leave the cathode in the form of a beam.

In the case in which several gas discharge electron guns are arranged in a circle, equal electron beams will be generated due to the fact that the gas discharge electron guns are equal.

These devices can operate at a rough vacuum (approximately $10^{-1} - 10^{-2}$ Torr) and are therefore particularly suitable for material working, for example, drilling, welding and lacquer hardening. Vapours and gases which are released during these operations disturb the vacuum comparatively little. An advantage of the above devices is that rough vacuum can be very rapidly reached.

However, it is desired to obtain a device having several gas discharge electron guns with a substantially identical electrode geometry in which several operations are carried out simultaneously on one or a number of work pieces and in which each gas discharge electron gun has its own beam intensity and beam shape adapted to the operation. The differences in beam intensity can be obtained by adjusting the pressure of each gas discharge electron gun. The drawback of this is, however, that the pumping capacity should be so large that in the most unfavourable case (much gas supply in all the guns) the gas discharge electron guns could still operate without influencing each other.

The current per flow discharge could also be adjusted by choosing for each gun and adapted acceleration voltage between the anode and cathode. A drawback of this is that no optimum power density can be obtained by a low acceleration voltage. As a result of this, bad welds may be the result. An additional drawback is that an adjusted supply voltage is necessary for each gas discharge electron gun individually, which is expensive and cumbersome.

It is an object of the invention to provide a device for the simultaneous operation of a number of gas discharge electron guns in which electron beams each having a desired intensity are obtained without a mutual influencing of the glow discharges occurring in each gun due to the fact that there are substantially no pressure differences between the guns. A further object of the invention is to provide a device in which the pumping capacity used is optimum. Still another object of the invention is to provide a device having a number of gas discharge electron guns with a substantially equal electrode geometry and a simple electric supply.

According to the invention, a device of the kind mentioned in the first paragraph is characterized in that the space between the cylindrical anode and the cathode is surrounded by a part of the envelope in such manner that in at least two gas discharge electron guns having a substantially identical electrode geometry the said space has a different volume, while substantially the same pressure prevails.

The invention is based on the recognition that the current through the glow discharge is also determined by the dimensions of the space in which the discharge takes place. It has been found in particular that a variation in the diameter of the discharge space has a large influence on the current through the discharge in the gas discharge electron gun, much larger than the influence of a variation in the distance between the anode and the cathode. The idea of using just said parameter for the adjustment of the current through the glow discharge in a gas discharge electron gun is quite new and presents many advantages over, for example, variations of the gas pressure (pressure of the gaseous ionisable medium). In the case of a smaller diameter of the space in which the discharge takes place, the current through the glow discharge becomes smaller and hence also the intensity of the produced electron beam.

In the said publication by R. A. Dugdale it is stated only that the p.d. requirement for the desired operating voltage must be satisfied, where p is the gas pressure and d a value associated with the distance between the anode and the cathode.

With a constant and substantially equal gas supply and acceleration voltage, various dimensions of the space between the cathode and the anode (discharge space) hence produce a quite different current through the glow discharge. This results in electron beams having a quite different intensity. It is an advantage that in the case in which guns have the same acceleration voltage, only one electric supply therefor is necessary. By varying the diameter of the discharge space and/or the distance between the anode and the cathode, gas discharge electron guns can be made having a substantially equal electrode geometry but a different volume of the discharge space. It has been found that a variation of the distance between the anode and the cathode only slightly influences the current-voltage characteristic. A larger distance between the anode and the cathode, however, means a system which is better from an electron-optical point of view.

Figure 2:
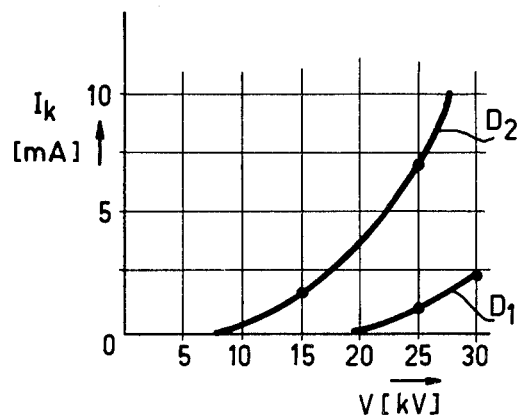

The invention will be described in greater detail with reference to the accompanying drawing, of which FIG. 1 is a diagramattic sectional view of a device according to the invention, and FIG. 2 shows the characteristics of two gas discharge electron guns having two different inside diameters.

Referring now to FIG. 1, two gas discharge electron guns A and B having diameters $D_1$ and $D_2$ of the discharge spaces 6 and 6', are arranged in communication with the evacuated envelope 1. These figures are diagrammatic sectional views of one embodiment. The diameters shown are 12 mm ($D_2$) and 17.4 mm ($D_1$), but the diameter can be varied over a much wider range.

Each gas discharge electron gun consists of an assembly of electrodes, in this case constructed from a cathode 2 and a cylindrical anode 3. The supply 5 supplies a stabilised voltage V and a limited current I. Via a controlled gas inlet valve 4, gas from the containers G is admitted to the discharge spaces 6 and 6'. A pressure of 0.01 to 0.1 Torr is maintained in the envelope 1 by means of a pump 7. By bringing the cathode at a strong negative voltage (for example 25 kV) relative to the anode 3, a glow discharge is formed in the discharge space 6. The positive ions formed in the glow discharge impinge against the cathode 2 as a result of which the cathode starts emitting electrons (secondary emission). Due to the shape of the electric field between the anode 3 and the cathode 2, to said electrons are focused into a beam. The current adjusted according to the invention can be stabilised by means of an already known control system (not shown in FIG. 1) which monitors variations in said current and corrects the variations by opening the inlet valve 4 to a greater or smaller extent so that the pressure of the gaseous ionisable medium in the discharge spaces 6 and 6' is controlled (small variations).

FIG. 2 shows the current-voltage characteristics of two gas discharge electron guns having diameters of 12 and 17.4 mm, respectively ($D_2$ and $D_1$). The smaller diameter has a characteristics which shows a considerably lower cathode current at the same acceleration voltage V. By varying a diameter of the discharge space, gas discharge electron guns can be obtained having a guite different current-voltage characteristic with the same electrode geometry. The anodes 3 may also be provided with diaphragms. The anodes may form parts of the wall of the envelope. The cathodes may be of the so-called "hollow-cathode" type in which the electrons are generated in the part of the glow discharge present in the hollow cathode or of the type as described in the aforementioned British publication by R. A. Dugdale in which the electrons are formed by secondary emission. The cathodes 2 may also be constructed so that always a different part of the cathode 2 is exposed to the ion bombardment. This may be done by a rotary cathode, for example.

The produced electron beams can be focused by means of electric and/or magnetic fields. By using one or more quadrupole lenses, an astigmatic beam can be obtained with which, for example, a linear weld can be made.

The voltage between the anode and the cathode may also be reversed and adapted so that an ion beam is formed instead of an electron beam.

What is claimed is:

1. A low pressure high voltage glow discharge device for simultaneously generating at least two beams of charged particles having different current intensities, comprising an envelope, a plurality of electron gun assemblies each including an anode and a cathode arranged at a distance from one another, the anodes and cathodes defining separate discharge spaces which communicate with said envelope, said discharge spaces having different volumes, means for maintaining substantially equal pressures in said discharge spaces and means for applying the same voltage to at least two of said electron gun assemblies, said two electron gun assemblies having substantially the same electrode geometry.

2. A device as claimed in claim 1, wherein the distance between the anode and the cathode in said two gas discharge electron guns is different.

3. The device of claim 1 wherein said discharge spaces have different diameters.

4. The device of claim 1 wherein said anodes are hollow, and said discharge spaces communicate with said envelope by way of said hollow anodes.

5. The discharge device of claim 1 wherein said means for maintaining substantially equal pressure comprises means for maintaining pressures within said discharge spaces of between $10^{-1}$ and $10^{-2}$ Torr was in said envelope.

6. The device of claim 1 further comprising common power supply for applying the same voltage to said two electron gun assemblies.

* * * * *

UNITED STATES PATENT AND TRADEMARK OFFICE
CERTIFICATE OF CORRECTION

PATENT NO. : 4,163,889
DATED : August 7, 1979
INVENTOR(S) : THEODORUS M.B. SCHOENMAKERS It is certified that error appears in the above-identified patent and that said Letters Patent are hereby corrected as shown below:

IN THE CLAIMS:

Col. 4, lines 38-39, delete "was in said envelope"

Col. 4, line 40, after "comprising" insert --a--

Signed and Sealed this

Twenty-seventh Day of November 1979

[SEAL]

Attest:

RUTH C. MASON
Attesting Officer

LUTRELLE F. PARKER
Acting Commissioner of Patents and Trademarks